United States Patent
Chiu

Patent Number: 5,431,178
Date of Patent: Jul. 11, 1995

[54] CENTRIFUGAL TYPE, ENCLOSED CLEANING APPARATUS

[76] Inventor: Hsien hsin Chiu, 1073, Kou Chi Road, Sec. 1, Taoyuan, Taiwan

[21] Appl. No.: 221,027
[22] Filed: Mar. 30, 1994
[51] Int. Cl.6 .............................................. B08B 3/02
[52] U.S. Cl. ................................. 134/57 R; 134/95.2; 134/95.3; 134/102.2; 134/109; 134/135; 134/140; 134/153; 134/155; 134/158; 134/162; 134/902
[58] Field of Search ............... 134/95.2, 95.3, 102.2, 134/103.2, 104.4, 109, 135, 140, 153, 155, 158, 162, 902, 57 R, 58 R

[56] References Cited

U.S. PATENT DOCUMENTS

| | | | |
|---|---|---|---|
| 3,673,042 | 6/1972 | Mayers | 134/155 X |
| 4,197,000 | 4/1980 | Blackwood | 134/95.3 X |
| 4,852,591 | 8/1989 | Wisotzki et al. | 134/158 X |
| 4,852,592 | 8/1989 | DiGangi et al. | 134/158 X |
| 4,986,290 | 1/1991 | Oguma et al. | 134/158 X |
| 5,213,117 | 5/1993 | Yamamoto | 134/102.2 X |
| 5,224,503 | 7/1993 | Thompson et al. | 134/95.3 X |
| 5,339,843 | 8/1994 | Benedict et al. | 134/95.2 X |

Primary Examiner—Philip R. Coe
Attorney, Agent, or Firm—Bacon & Thomas

[57] ABSTRACT

A centrifugal type, enclosed cleaning apparatus including a housing to hold the parts thereof, a washing container fastened in a hole on the housing, a lifting unit on the housing at the top, a stirrer unit having a base coupled to the lifting arm of the lifting unit and a material carrier with a shaft received inside the washing container and coupled to the transmission shaft of a power device and driven to turn within the washing container in causing a centrifugal effect, a cleaning unit consisted of a chemical pre-wash trough, a chemical trough, an inert air supply pipe assembly, an air compressing pipe assembly, a water trough, a water spray pipe assembly, and a separating trough, a drying unit, and a programmable control unit to control the operation of the lifting unit, the stirrer unit, the cleaning unit, and the drying unit in cleaning the products placed in the material carrier.

2 Claims, 7 Drawing Sheets

CENTRIFUGAL TYPE, ENCLOSED CLEANING APPARATUS

BACKGROUND OF THE INVENTION

The present invention relates to a centrifugal type, enclosed cleaning apparatus used to clean electronic products (for example: integrated circuit boards) by means of a centrifugal effect during the circulation of a chemical solution or clean water.

FIG. 7 illustrates a prior art cleaning apparatus used to clean electronic products. The cleaning apparatus, referenced by (8), comprises an elongated casing (81) shaped like a tunnel kiln, and a meshed conveying belt (82). The casing (81) has two protruding ports (812) at two opposite ends (811) thereof over which the conveying belt (82) extends for placing or removing the products (9). When operated, the products (9) are delivered through a chemical trough (83) in the casing (81) by the conveying belt (82), symmetrical spray nozzles (831) at different elevations are controlled to spray a chemical solution (832) over the products (9). At the same time, an ultrasonic generator (833) is turned on to produce ultrasonic waves in removing dirts from the products (9). After passed through the chemical trough (83), air nozzles (834) are operated to blow air toward the products (9) in removing residual chemical solution (832) from the products (9), and then the products (9) are moved through a plurality of water troughs. The water troughs are moved in the reverse direction against the conveying belt (82). While passing through the water troughs, a clean water from a water supply source (84) is pumped to spray nozzles (841) to spray-wash the products (9). The sprayed water is then guided to a first water trough (842), which has a water pump (843) controlled to pump the water for washing the products (9) through spray nozzles (844). Because the clean water from the water supply source (84) is continuously supplied, overflow of water flows from the first water trough (842) to a second water trough (845), which comprises a water pump (848) controlled to pump the water for washing the products through spray nozzles (847). There is a water pipe assembly (848) to guide waste water from the water troughs to a reclaiming device (85) where waste water is treated for recycling. After having been moved away from the water troughs, air nozzles (849) are controlled to blow air in removing residual water from the products (9), and then the products (9) are dried by hot air from hot air holes (86). Finally, the products (9) are moved out of the casing (81) through the outlet port (812). Electric heaters (87) are produced to heat the solution and water for washing the products (9) efficiently. This structure of cleaning apparatus is still not satisfactory in function. During the operation of the apparatus, the heat of the heated solution will to escape from casing (81) through the ports (812), and the gas released from the chemical solution will also escape from the casing (81) to cause an environmental pollution. Another disadvantage of this structure of cleaning apparatus is its heavy size which needs much installation space, consumes much energy, and simultaneously increases its manufacturing cost. The use of the meshed conveying belt (82) hinders the products (9) from being fully washed. Further, because the products (9) are moved in one direction while washing, it is difficult to remove dirts from gaps in the components on the products (9). Therefore, the products (9) may have to be washed manually after they have been washed through the cleaning apparatus.

SUMMARY OF THE INVENTION

The present invention has been accomplished under the aforesaid circumstances. It is therefore an object of the present invention to provide a cleaning apparatus for cleaning electronic products or the like which is an enclosed type, and does not cause any pollution problem during its operation. It is another object of the present invention to provide a cleaning apparatus for cleaning electronic products or the like which is safe in use. It is still another abject of the present invention to provide a cleaning apparatus for cleaning electronic products or the like which can fully clean the products in all directions. It is still another object of the present invention to provide a cleaning apparatus for cleaning electronic products or the like which needs less installation space. It is still another object of the present invention to provide a cleaning apparatus for cleaning electronic products or the like which is inexpensive to manufacture. It is still another object of the present invention to provide a cleaning apparatus for cleaning electronic products or the like which produces a centrifugal effect to effectively clean the products.

DESCRIPTION OF THE PREFERRED EMBODIMENTS

Figure 1:
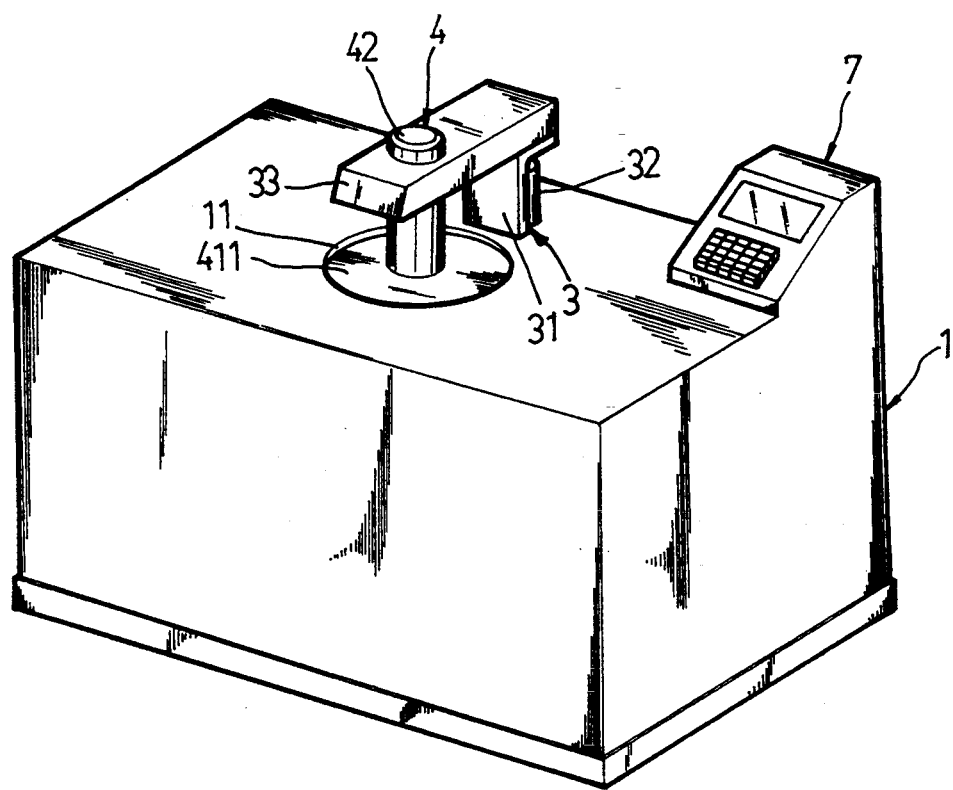
FIG. 1 is an elevational view of a cleaning apparatus constructed according to one embodiment of the present invention.
Figure 2:
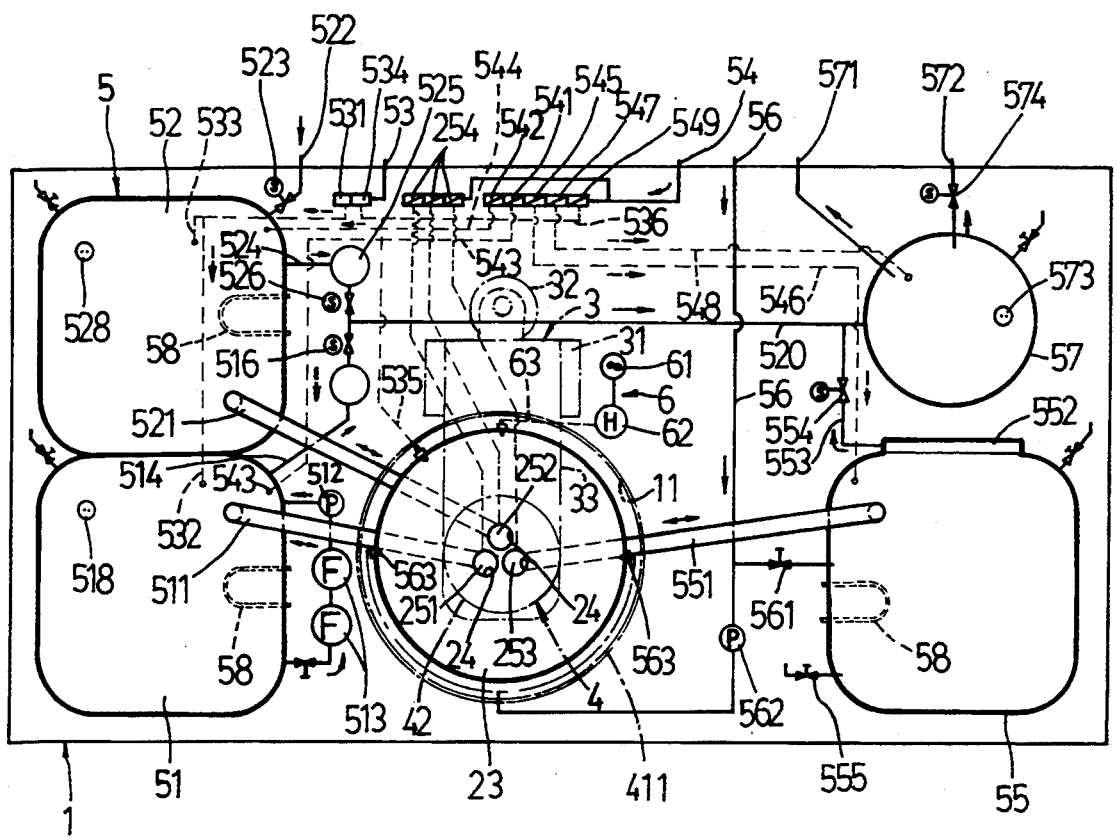
FIG. 2 is a sectional top view of the cleaning apparatus shown in FIG. 1.

Referring to FIGS. 1, 2, 3, and 4, a cleaning system constructed in accordance with the present invention is generally comprised of a housing 1, a washing container 2, a lifting unit 3, a stirrer unit 4, a cleaning unit 5, a drying unit 6, and a control unit 7.

Referring to FIGS. 2 and 3 again, the housing 1 comprises a through hole 11 at the top, to which the top flange 21 of the washing container 2 is connected and sealed with a seal ring 22. The bottom wall 23 of the washing container 2 is curved inwards, having drain holes 24 with operative valves 251;252;253. The lifting unit 3 comprises an upright casing 31 fixed to the housing 1 at the top, a transmission mechanism 32 inside the housing 1, and a lifting arm 33 moved by the transmission mechanism 32 in the vertical direction along the upright casing 31.

The stirrer unit 4 comprises a base 41 connected to the lifting arm 33, and a power device 42. The base 41 of the stirrer unit 4 is fastened with a presser disk 411 at the bottom operatively pressed against the seal ring 22 of the washing container 2, which has a mounting hole 412 to which the shaft 431 of a material carrier 43 is detachably fastened. When assembled, the shaft 431 of the material carrier 43 is coupled to the transmission shaft 421 of the power device 42, and the presser disk 411 of the base 41 of the stirrer unit 4 is firmly stopped at the seal ring 22 to cover the top flange 21 of the washing container 2. Therefore, turning on the power unit 42 causes the transmission shaft 421 to turn the material carrier 43 round and round within the washing container 2 via the shaft 431. The material carrier 43 is designed in shape according to the products 9 to be cleaned. The power unit 42 may be controlled to turn the material carrier 43 at variable speed and length of time according to the type of the products 9 to be cleaned.

The cleaning unit 5 may be variously embodied according to the type of the products 9 to be cleaned. In the embodiment shown in FIGS. 2 and 3, the cleaning unit 5 comprises a chemical pre-wash trough 51 and a chemical trough 52. There are two pipes 511 and 521 having each one end connected to the respective operative valve 251 or 252 on the bottom of the washing container 2 and an opposite end suspended in the trough 51 or 52. The solution in the chemical pre-wash trough 51 is constantly circulated through a filter assembly 513 by means of the operation of a pump unit 512. There is a chemical supply pipe 522 controlled by an operative valve 523 to supply a liquefied cleaning chemical to the chemical trough 52, and an inert air supply pipe assembly 53 controlled by an operative valve 531 to supply an inert gas (for example: nitrogen) to the troughs 51 and 52 through a respective branch pipe 532 or 533 for isolation from outside air.

The trough 51 or 52 is connected to a respective water level regulating cylinder 515 or 525 through a respective connecting pipe 514 or 524. The water level regulating cylinder 515 or 525 is connected to a common drain pipe 520 through a respective control valve 516 or 526. An air compressing pipe assembly 54 is controlled to deliver a flow of compressed air to the trough 51 or 52 through a respective control valve 541 or 542 and a respective branch pipe 543 or 544 in forcing the respective solution from the trough 51 or 52 to the washing container 2 in proper order.

The cleaning unit 5 further comprises a water trough 55. There is a pipe 551 having one end connected to the other operative valve 253 on the bottom of the washing container 2 and an opposite end suspended in the water trough 55. The water trough 55 comprises an overflow chamber 552 having an overflow pipe 553 connected to the drain pipe 520 via a control valve 554, and an exhaust pipe 555 at the top for the passage of air. The air compressing pipe assembly 54 further comprises a branch pipe 546 controlled by a respective control valve 545 to deliver a flow of compressed air to the water trough 55 in forcing water from the water trough 55 into the washing container 2 via the pipe 551. There is a water spray pipe assembly 56 controlled by a pump 562 through a control valve 561 to spray pressured clean water into the washing container 2 through nozzles 563 around the washing container 2 for washing the products 9 to be washed.

The cleaning unit 5 also comprises a separating trough 57 to receive the liquid from either trough 51, 52 or 55 via the drain pipe 520, a first outlet pipe 571 connected to a waste chemical solution treatment device (not shown) and a second outlet pipe 572 connected to a waste water treatment device (not shown) for respective waste disposal or recycling. The air compressing pipe assembly 54 further comprises a branch pipe 548 controlled by a respective control valve 547 to deliver a flow of compressed air to the separating trough 57 in forcing out the liquid contained therein.

The inert air supply pipe assembly 53 has a branch pipe 535 controlled by a control valve 534 to deliver a flow of nitrogen into the washing container 2 in isolating the chemical solution from external air as the products 9 are being washed by a chemical solution in the washing container 2. A branch pipe 536 is connected between the branch pipe 535 and the air compressing pipe assembly 54 and controlled by a control valve 549. Therefore, a compressed flow of air can be delivered to mix with the nitrogen supplied from the inert air supply pipe assembly 53. Compressed air is guided into the washing container 2 through the operative valve 254 via a connecting pipe 253 for controlling the operation of the other valves on the washing container 2. Alternatively, the valves on the washing container 2 may be controlled by an electric control circuit (this is of the known art and needs not to be described in detail).

The drying unit 6 comprises an air blower 61 and an electric heater 62, and is controlled to provide a flow of hot air into the washing container 2 during the water washing cycle in drying the products being washed and warning up the water contained in the water trough 55. Water level detectors 518, 528 and 573 are respectively fastened in the troughs 51,52 and 57 to detect the respective liquid level.

The control unit 7 comprises a control panel 71 mounted on the housing 1 at the top for controlling the operation of the cleaning apparatus. The control unit 7 is programmable so that the operation of the cleaning apparatus can be changed according to the type of the products 9 to be cleaned.

After the operation parameters have been set through the control panel 71, the products 9 to be cleaned are placed in the material carrier 43, the shaft 431 of the stirrer unit 4 is then inserted in the mounting hole 412 and coupled to the transmission shaft 421, and then the lifting unit 3 is controlled to lower the material carrier 43 and the products 9 therein into the washing container 2 at a suitable elevation for permitting the presser disk 411 to press on the seal ring 22 at the top of the washing container 2. The water level regulating cylinders 515,525 are normally closed.

When the valve 251 between the pipe 511 and the washing container 2 is opened by means of the control of the control unit 7, the control valve 541 is simultaneously opened to let a flow of compressed air flow through the branch pipe 543 into the chemical prewash trough 54 in forcing the solution from the chemical pre-wash trough 54 into the washing container 2 via the pipe 511. As soon as the washing container 2 has been filled with sufficient solution from the chemical pre-wash trough 54, the valves 251 and 541 are closed again. Then, the power device 42 is turned on to turn the material carrier 43 and the products 9 back and forth alternatively or round and round in either direction within the washing container 2 for permitting the products to be washed by the solution 510. Turning the material carrier 43 and the products 9 in the solution 510 causes a centrifugal motion, and therefore dirts can be effectively removed from the gaps in the products. After a certain length of time in washing, the operative valve 251 and the control valve 549 are opened to let a flow of compressed air enter the washing container in moving the solution 510 flow back to the chemical pre-wash trough 51 while the material carrier 43 being continuously turned to shake off dirts. After the solution 510 has been completely drawn away from the washing container, the operative valve 251 is closed again, and the operative valve 252 on the branch pipe 521 and the control valve 542 on the pipe 544 are respectively opened to let a flow of compressed air flow into the chemical trough 52 in forcing the solution 530 from the chemical trough 52 into the washing container 2, and then the valves 252 and 254 are closed and the material carrier 43 is driven by the power device 42 to rotate within the washing container 2 for permitting the products 9 to be washed by the solution 530. Similar to the aforesaid first washing procedure, the valve 252 is opened again to let the solution 530 flow back to the chemical trough 52 after a fixed length of time in wash, then the valves 554 and 555 are closed, and then the valves 253 and 545 are opened to let a flow of compressed air enter the water trough 55 in forcing a flow of cleaning water 550 from the water trough 55 into the washing container 2 for permitting the products 9 to be washed by the cleaning water 550.

After the water 550 has been drawn away from the washing container 2, the valve 253 keeps opened, and the pump 562 is turned on to pump a flow of clean water into the water spray pipe assembly 56, and therefore streams of water are ejected through the nozzles 563 to wash the products 9 while the products 9 are rotated by the material carrier 43. At the same time, waste water is guided into the water trough 55. After the set time is up, the pump 562 is turned off, and the air blower 62 and electric heater 62 of the drying unit 6 are respectively turned on to produce a heated current of air toward the washing container 2 in drying up the products 9. The heated current or air is simultaneously guided into the water trough 55 to warm up the water therein. Sprayed water from the nozzles 563 is then guided into the water trough 55, and the excess water will be then guided into the separating trough 57 through the overflow chamber 552 and the overflow pipe 553.

Figure 3:
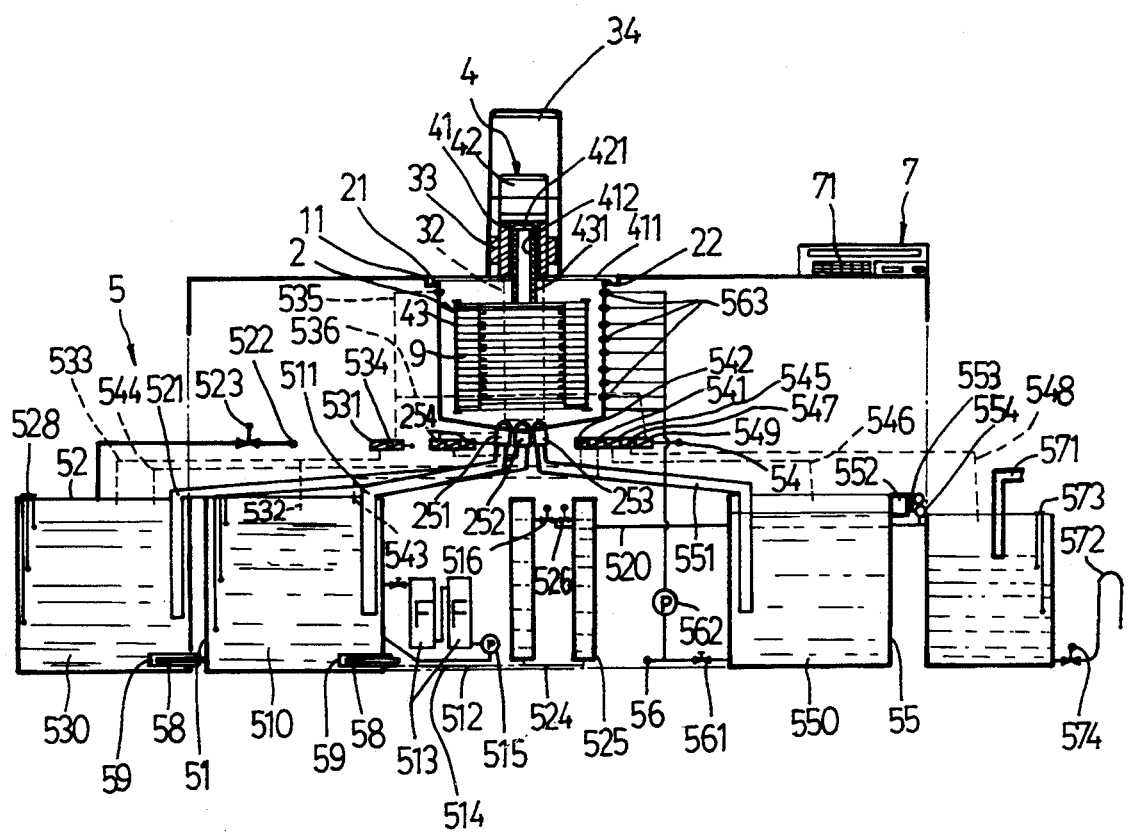
FIG. 3 is a sectional elevation of the cleaning apparatus shown in FIG. 1.
Figure 4:
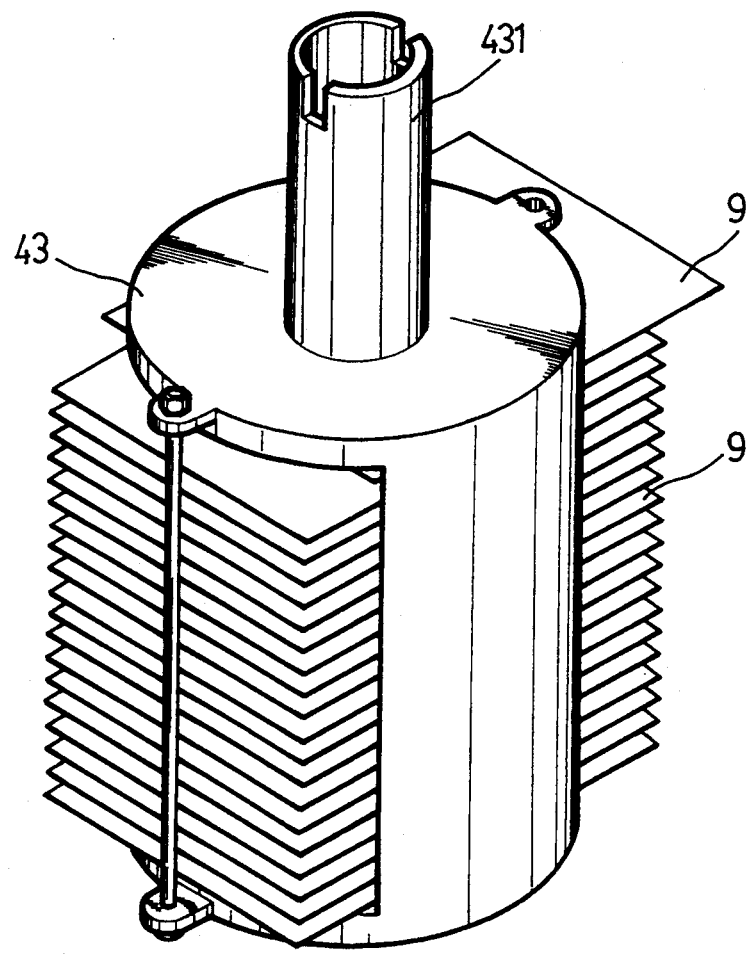
FIG. 4 is a perspective view of a material carrier according to the present invention.

While circulating through the washing container 2, dirts may be carried into the troughs 51 and 52 and settled to the bottom (see FIG. 3). When either trough is accumulated with sediment, the respective liquid level will be relatively increased. Once the liquid level in the trough 51 or 52 reaches a predetermined range, it is immediately detected by the respective water level detector 518 or 518, and the valve 516 or 526 will be opened to let the respective solution be drawn away from the trough 51 or 52 into the separating trough 57. Similarly, the overflow in the water trough 55 will be delivered to the separating trough 57 through the overflow chamber 522 and the overflow pipe 553.

The separating trough 57 receives the overflow drawn away from the water level regulating cylinders 515 and 525 and the water trough 55. The separating trough 57 comprises a water level detector 573 to detect the liquid level therein. When the liquid level In the separating trough 57 reaches the critical level, the control unit 7 turns off the valves 572 and 554 and opens the valve 572 for inducing a compressed flow of air in forcing the suspended solution out of the separating trough 57 through the first outlet pipe 571.

The water trough 55 is frequently supplied with water from the water spray pipe assembly 56 during the operation of the cleaning apparatus. The supply of the chemical solution for the chemical trough 52 is automatically controlled by the water level detector 528, which controls the operation of the control valve 523 of the chemical supply pipe 522. The supply of the chemical solution for the chemical pre-wash trough 51 is controlled by the water level detector 518, which gives a signal to the control unit 7 when the liquid level in the chemical pre-wash trough 51 drops to a predetermined range. Upon receipt of the signal from the water level detector 518, the control unit 7 is operated to let the chemical solution 530 flow from the chemical trough 52 to the washing container 2, and to open the valves 511 and 521 for permitting part of the chemical solution 530 to flow to the chemical pre-wash trough 51 when the chemical 530 is guided back to the chemical trough 52.

The inert gas control valve 531 is normally opened for permitting an inert gas to fill in the chemical pre-wash trough 51 and the chemical trough 52 in isolating the contained chemical solution from outside air. The valve 534 is opened when the chemical solution from either trough is filled into the washing container 2. The chemical pre-wash trough 51, the chemical trough 52, and the water trough 55 may be respectively mounted with an electric heater 58 to heat the chemical solution or water for quick washing. The electric heater 58 is received inside a water container 59, which is filled with water, and controlled to heat the chemical solution through the water container 59. Because the chemical solution is indirectly heated, danger is eliminated.

Figure 5:
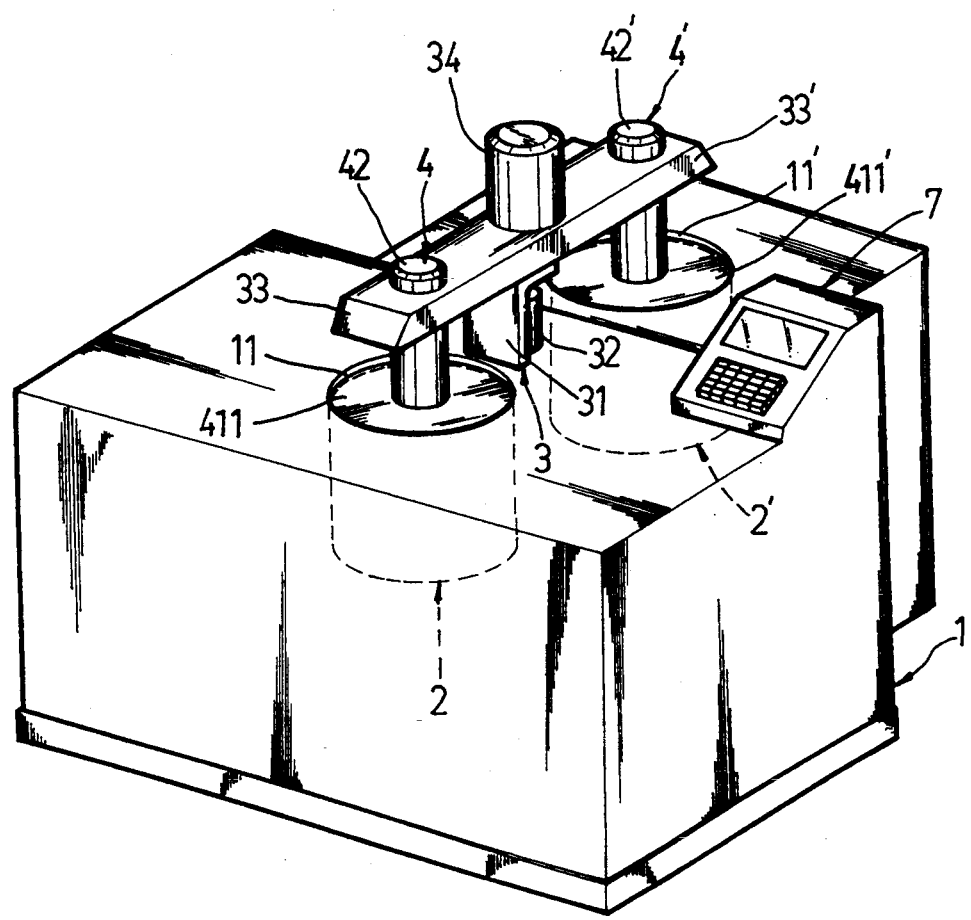
FIG. 5 is a perspective view of an alternate form of the cleaning apparatus of the present invention.
Figure 6:
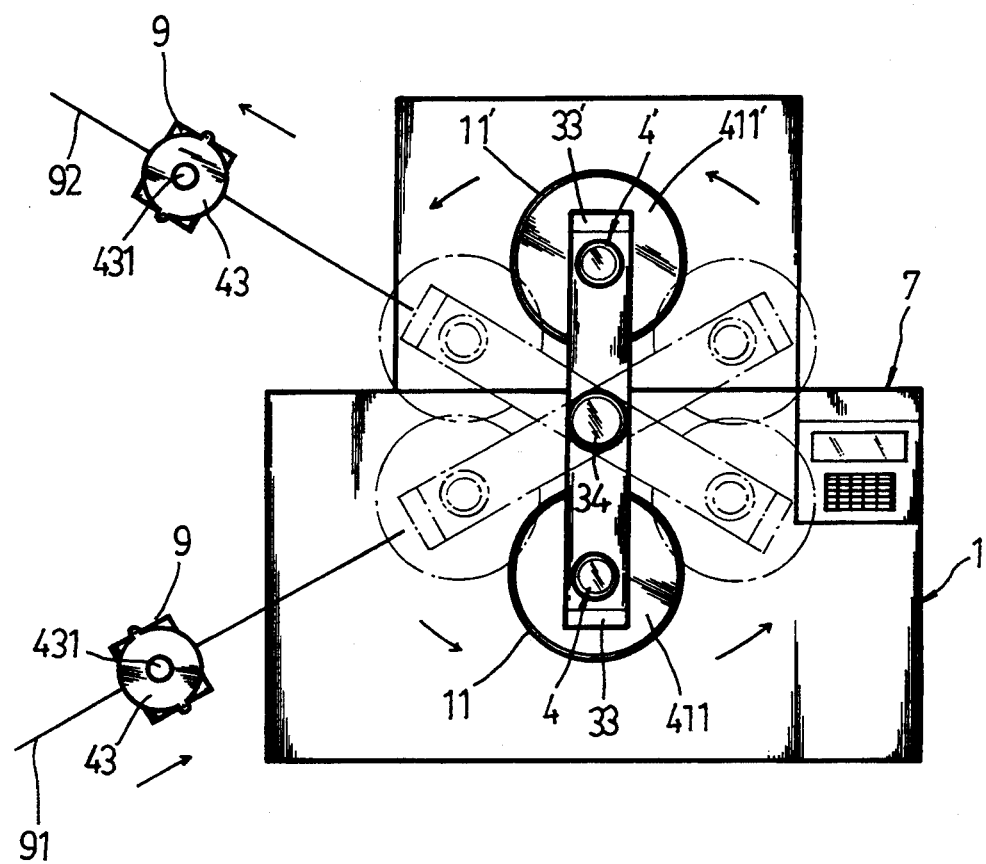
FIG. 6 is a top view showing the alternate form of the cleaning apparatus of FIG. 5 operated.
Figure 7:
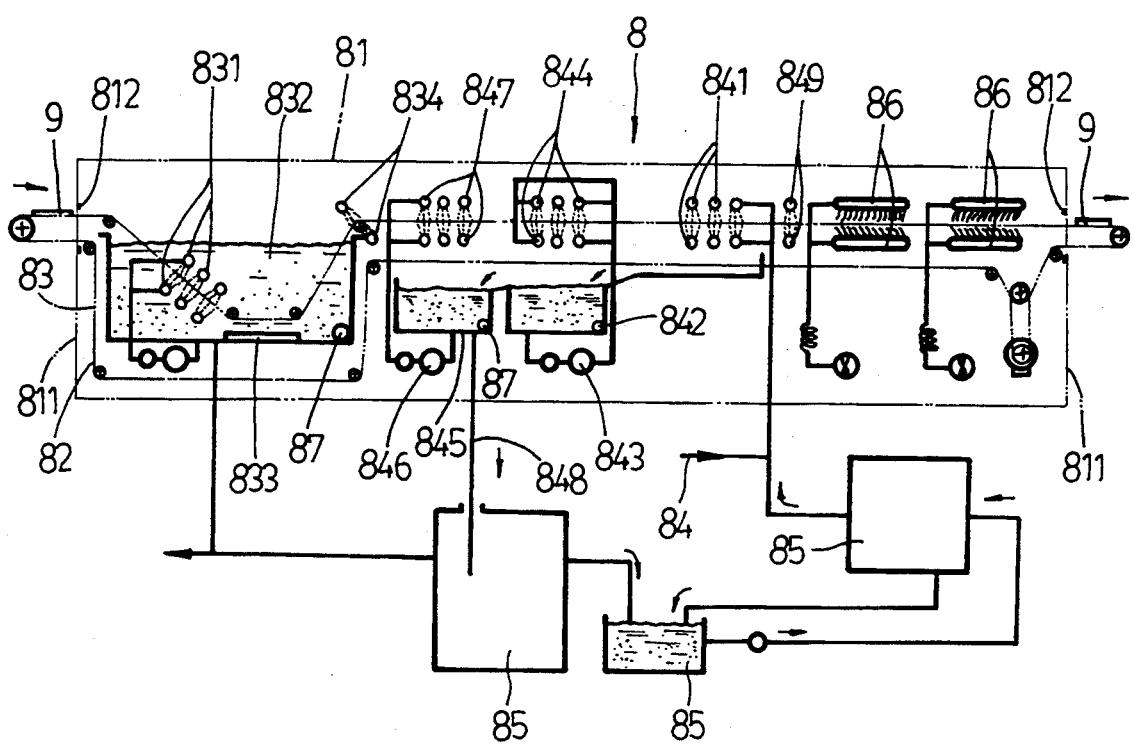
FIG. 7 is a plan view of a cleaning apparatus according to the prior art.

Referring to FIG. 5, therein illustrated is an alternate form of the cleaning apparatus. As illustrated, the housing 1 comprises an additional through hole 11' at the back, defining a drying container 2'. The drying container 2' is linked to the cleaning unit 5 and the drying unit 6. Two arms 33;33' are respectively connected to a rotary power device 34 to hold two mechanisms 4;4' for stirring and drying operations respectively. When operated, as shown in FIG. 6, the rotary power device 34 turns step by step around a circle (at 60° angle per step), the products to be cleaned are moved through an input conveyer 91, and the products well cleaned are carry away from the housing 1 by an output conveyer 92. This arrangement allows the stirring and drying processes to be synchronously performed.

I claim:
1. A cleaning apparatus comprising:
   a housing having a through hole at a top;
   a washing container having a top flange with a top opening, a rubber seal ring mounted on the top flange around the top opening and a bottom wall curved inwards, the bottom wall having a plurality of holes with respective operative valves;
   a lifting unit on said housing, comprising an upright casing fixed to the top of said housing and a lifting arm movable by a transmission mechanism in a vertical direction along said upright casing;
   a stirrer unit comprising a base connected to said lifting arm, a presser disk configured to be operatively pressed against the seal ring on said washing container to seal the top opening thereof, a material carrier having a shaft inserted in a mounting hole on the base, and a power drive having a transmission shaft;
   a material carrier supporting product to be cleaned, the material carrier having a shaft coupled to the transmission shaft, said material carrier being driven by said power drive to turn the products to be cleaned in either direction within said washing container;
   a cleaning unit comprising a chemical pre-wash trough, a chemical trough, a water trough, a sepa- rating trough, a water spray pipe assembly, and an air compressing pipe assembly, said chemical pre-wash trough, said chemical trough, and said water trough each having a respective pipe connected to an operative valve on said washing container for the circulation of the respective chemical solution or water between said washing container and respective trough, said chemical pre-wash trough and said chemical trough each having a bottom pipe connected to a water level regulating cylinder for controlling liquid level therein, said water trough having an overflow chamber with an overflow pipe for draining off overflowed liquid and guiding out suspension solution to said separating trough, said air compressing pipe assembly comprising pipes respectively controlled to guide compressed air into said chemical pre-wash trough, said chemical trough, and said water trough to force the solution or water therefrom into said washing container for washing the products held in said material carrier, and into said separating trough to force out the suspension solution, said separating trough having a drain pipe at the bottom for drawing away sediment, said water spray pipe assembly comprising a plurality of nozzles symmetrically mounted on said washing container and controlled to spray water into said washing container to wash the products held in said material carrier, the sprayed water being guided to said water trough for further circulation;

a drying unit comprising an air blower and an electric heater, controlled to produce a flow of hot air into said washing container for drying the products being cleaned and warming the water contained in said water trough; and a control unit including a programmable control panel mounted on the top of said housing for controlling the operation of the apparatus, whereby said control unit is controlled by a water level detector in said chemical pre-wash trough to let the chemical solution flow from said chemical trough to said washing container, and then to open the respective operative valves for permitting part of the chemical solution to flow to said chemical pre-wash trough during the return flow and the chemical solution to said chemical trough, and when the liquid level in said chemical pre-wash trough is automatically supplied with the chemical solution from the chemical container controlled by a control valve and a water level detector.

2. The cleaning apparatus of claim 1 further comprising:

a drying container in a through hole on said housing and linked with said washing container, said drying unit and said cleaning unit;

a rotary power device mounted on said lifting unit;

two supporting arms respectively connected to said rotary power device; and two transmission mechanisms respectively mounted on said supporting arms and disposed in said washing container and said drying container.

* * * * *